United States Patent
Kang (10) Patent No.: US 7,965,557 B2
(45) Date of Patent: Jun. 21, 2011

(54) FLASH MEMORY DEVICE AND SET-UP DATA INITIALIZATION METHOD

(75) Inventor: Sang-Gu Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 310 days.

(21) Appl. No.: 12/061,849

(22) Filed: Apr. 3, 2008

(65) Prior Publication Data

US 2008/0253191 A1    Oct. 16, 2008

(30) Foreign Application Priority Data

Apr. 16, 2007    (KR) .................. 10-2007-0037058

(51) Int. Cl.
*G11C 11/34*    (2006.01)

(52) U.S. Cl. ......... 365/185.18; 365/185.17; 365/189.07; 365/200; 711/129; 711/165; 711/170

(58) Field of Classification Search ............ 365/185.18, 365/185.17, 185.33, 189.05, 189, 200; 711/129, 711/165, 170, 173
See application file for complete search history.

(56) References Cited

U.S. PATENT DOCUMENTS

| 4,752,914 A | | 6/1988 | Nakano et al. | |
| 6,130,837 A | * | 10/2000 | Yamagami et al. | 365/185.09 |
| 6,751,122 B2 | * | 6/2004 | Kawai et al. | 365/185.09 |
| 7,802,072 B2 | * | 9/2010 | Takemura | 711/173 |
| 2006/0098957 A1 | * | 5/2006 | Jeong | 386/125 |

FOREIGN PATENT DOCUMENTS

| KR | 100247050 B1 | 12/1999 |
| KR | 1020030051407 A | 6/2003 |
| KR | 1020030059483 A | 7/2003 |
| KR | 1020060018335 A | 3/2006 |

* cited by examiner

*Primary Examiner* — Pho M Luu
*Assistant Examiner* — Tha-O Bui
(74) *Attorney, Agent, or Firm* — Volentine & Whitt, PLLC (57) ABSTRACT

A flash memory device includes a memory cell array having a set-up data region configured to store set-up data, wherein the set-up data includes first data and second data. The second data is stored in an empty cell area of the set-up data region. The flash memory also includes a page buffer and decoder configured to read the set-up data from the set-up data region, and a status detector receiving the set-up data from the page buffer and decoder and configured to discriminate the first data from the second data and generate a Pass/Fail status signal.

20 Claims, 9 Drawing Sheets

Fig. 1

(CONVENTIONAL ART)

FLASH MEMORY DEVICE AND SET-UP DATA INITIALIZATION METHOD

CROSS REFERENCE TO RELATED APPLICATIONS

This U.S. non-provisional patent application claims priority under 35 U.S.C §119 to Korean Patent Application No. 10-2007-0037058 filed on Apr. 16, 2007, the subject matter of which is hereby incorporated by reference.

BACKGROUND OF THE INVENTION

The present invention relates to a semiconductor memory device. More particularly, the invention relates to a semiconductor memory device and initializing method providing high reliability in set-up data.

Semiconductor memory devices may be generally categorized as volatile or non-volatile in their operative nature. Volatile memory devices access data rapidly, but lose stored data when power is interrupted. In contrast, non-volatile memory devices retain stored data in the absence of applied power.

Non-volatile memory devices include the Mask Read-Only Memory (MROM), Programmable Read-Only Memory (PROM), Erasable Programmable Read-Only Memory (EPROM), and Electrically Erasable Programmable Read-Only Memory (EEPROM). It is relatively difficult to write data to MROM, PROM and EPROM devices. Since they do not suffer under this disability, EEPROM devices find increasing acceptance in a variety of applications. So-called flash memory, one type of EEPROM storing one or more data bits per constituent memory cell, is particularly well suited for applications that require large data storage capacity in a highly (or densely) integrated design. NAND-type flash memory is especially capable of being highly integrated, as compared with other types of flash memory.

However, the highly integrated nature of contemporary NAND flash memory results in a corresponding decrease in circuit line width, an increase in the number of related fabrication processes, and an overall increase in the complexity of the final device. These outcomes may cause a decrease in the functional yield of the NAND flash memory devices, or memory cells within same.

In order to improve fabrication yield, certain semiconductor memory devices, not just NAND flash memory, are implemented with one or more extra memory cell, hereafter referred to as redundant memory cell(s). A redundant memory cell may be used to functionally replace a defective memory cell. Accordingly, a memory device incorporating one or more redundant memory cells must include means for converting the address of a defective memory cell into an address that will access a corresponding redundancy memory cell.

When a defective memory cell is detected during device testing, the address of the defective cell is converted into a redundant memory cell address through a series of processes, such as fuse cutting in a fuse box within the memory device. As a result of this memory cell "repair" capability, a relatively small number of defective memory cells will not result in a failed memory device. Consistent with this repair capability, the respective addresses of defective memory cells are stored in a non-volatile memory during device testing. These addresses may then be read upon system initialization (i.e., upon memory device power-up).

Memory system initialization involves a great many processes, such as the definition of various internal voltages. Such voltages are direct current (DC) signals and are usually generated by voltage generator within the memory device. The respective levels of such DC voltages are determined according to optimal (or assumed "standard") conditions during memory device design, and optimum operation of the memory device is closely related to the proper definition of these levels. However, due to fabrication process or operating condition variations, certain DC voltages generated within the memory device may not correspond to optimal definitions. In order to adjust or "trim" the value of DC voltages to better correspond with defined parameters, so-called DC trimming data may be stored in a non-volatile memory within the memory device. Subsequently, one or more DC voltage(s) may be trimmed according to the DC trimming data which is read during a memory system initialization.

Figure 1:
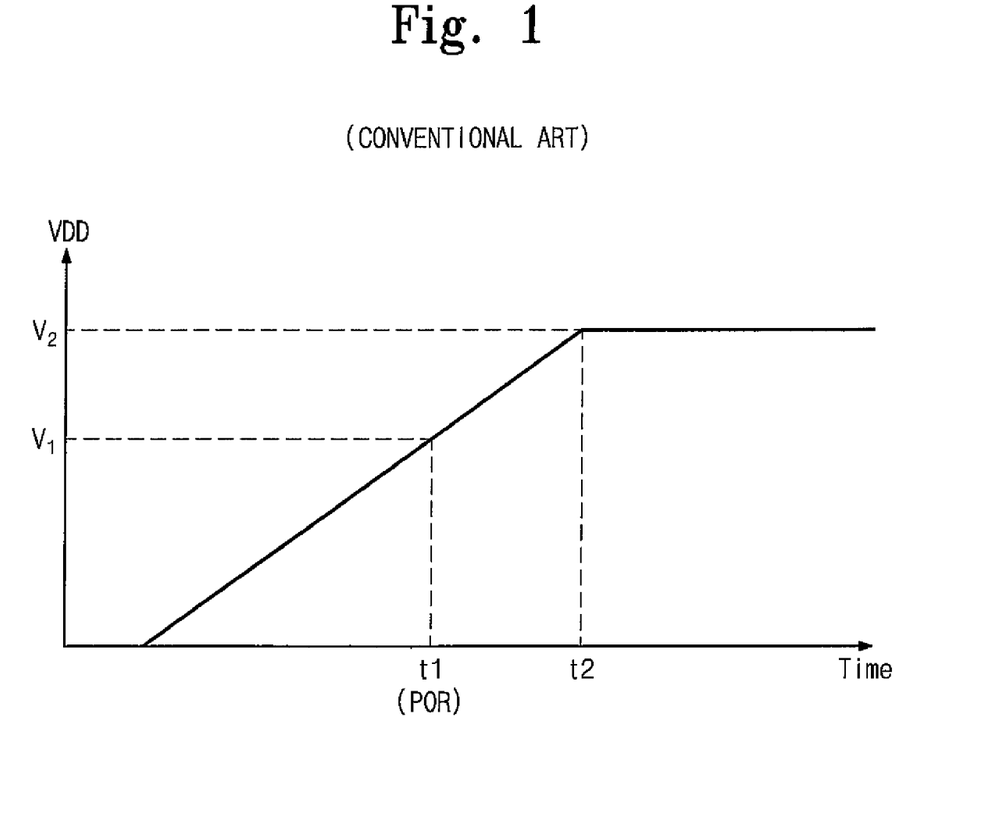
FIG. 1 illustrates change in power voltage during a power-up operation.

FIG. 1 is a waveform diagram illustrating the change of an internal power voltage generated within a semiconductor memory device upon system initialization. Referring to FIG. 1, system initialization for the memory device generally begins before the internal power voltage VDD reaches a defined voltage level of $V_2$. That is, the memory device may begin initialization (e.g., execute a Power-On Reset (POR) operation) when the internal power voltage VDD reaches a threshold voltage $V_1$ which is less than the defined voltage $V_2$.

Once memory system initialization begins, set-up data is read from an initialization memory (e.g., an assigned portion of the greater memory cell array for the memory device), and repair operations directed to defective memory cells and/or a trimming operations directed to various DC voltages may be performed in accordance with the set-up data. Unfortunately, the set-up data is read before the internal power voltage VDD stabilizes at its defined level $V_2$. The set-up data is also read before critical DC voltages are trimmed in accordance with trimming data stored as part of the set-up data. Thus, it is highly possible for one or more data read errors to happen when the set-up data is read during system initialization. Apart from the level of certain applied voltages, some memory cells in the initialization memory may be defective. From such defective memory cells, one or more errors may be included in the set-up data resulting in reduced reliability of the memory device.

SUMMARY OF THE INVENTION

Embodiments of the invention provide a flash memory device and a related initialization method that yield more reliable set-up data upon memory system initialization.

In one embodiment, the invention provides a flash memory device comprising; a memory cell array including a set-up data region configured to store set-up data, wherein the set-up data comprises first data and second data, the second data being stored in an empty cell area of the set-up data region, a page buffer and decoder configured to read the set-up data from the set-up data region, and a status detector receiving the set-up data from the page buffer and decoder and configured to discriminate the first data from the second data and generate a Pass/Fail status signal.

In another embodiment, the invention provides a method of initializing a flash memory device having set-up data programmed in a set-up data region of a memory cell array, the method comprising; programming first data of the set-up data using a spread data programming technique, programming second data of the set-up data in an empty cell area of the set-up data region according to a predetermined pattern, upon initialization of the flash memory device, reading the set-up data and decoding the set-up data to discriminate between the first data and the second data, determining whether one or more errors is apparent in the first data and storing the first data in a register.

In another embodiment, the invention provides a memory system comprising; a flash memory device and a memory controller configured to control the flash memory device. The flash memory device comprises; a memory cell array including a set-up data region configured to store set-up data, wherein the set-up data comprises first data and second data, the second data being stored in an empty cell area of the set-up data region, a page buffer and decoder configured to read the set-up data from the set-up data region, and a status detector receiving the set-up data from the page buffer and decoder and configured to discriminate the first data from the second data and generate a Pass/Fail status signal.

DESCRIPTION OF EMBODIMENTS

Embodiments of the invention will now be described with reference to the accompanying drawings. However, the invention may be embodied in many different forms and should not be construed as being limited to only the illustrated embodiments. Rather, these embodiments are presented as teaching examples.

Figure 2:
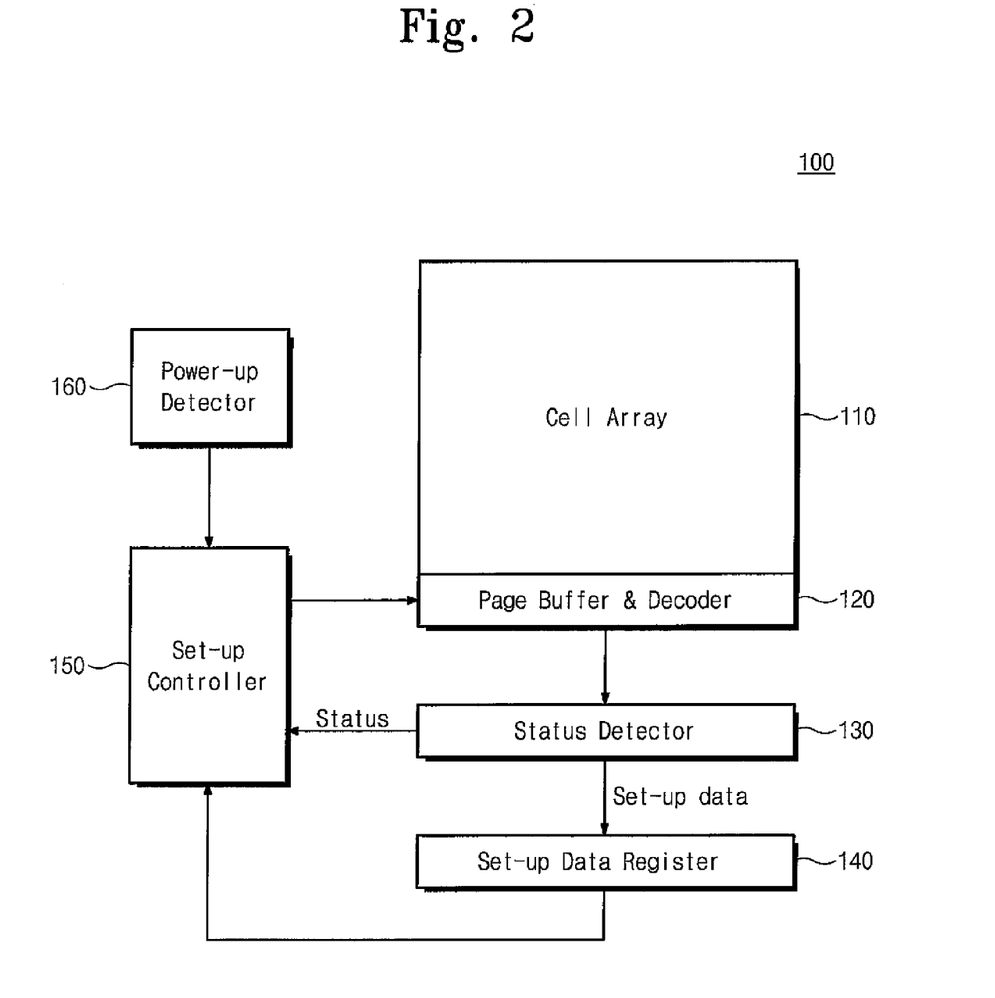
FIG. 2 is a block diagram briefly illustrating a configuration of a flash memory device for performing an initializing operation according to the present invention.

FIG. 2 is a block diagram of a flash memory device 100 according to an embodiment of the invention. In a memory cell array 110 of flash memory device 100, set-up data is programmed using conventionally understood techniques. When an initialization operation begins upon power-up of flash memory device 100, the set-up data stored in memory cell array 110 is read and transferred to a status detector 130. Status detector 130 interrogates the set-up data to determine whether the set-up data read operation has been successfully performed (i.e., whether one or more errors is present in the read set-up data). Status detector 130 then restores the set-up data. This general process will be described in some additional detail below.

In the illustrated embodiment, memory cell array 110 is implemented using conventionally configured NAND flash memory cells. That is, the NAND flash memory cells are configured in a string arrangement and connected in parallel to a bit line. Selected memory cells from a plurality of strings form a memory block which serves as the basic unit for erasing data. Memory cell array 110 comprises a normal data region storing general data programmed during normal memory system operations, and a set-up data region storing set-up data read during system initialization.

Memory cell repair data associated with identified defective memory cells and/or trimming data used to trim the level of certain DC voltages may be stored in the set-up data region. Whereas the trimming data typically has a fixed size, the repair data will vary with the number of defective memory cells. Because allowance must be made for a greater number of defective memory cells than will typically be identified, the set-up data region will usually include certain "empty memory cells" (i.e., a "empty area not used to store set-up data). Accordingly, when an initialization operation is performed, the set-up data including data stored in the empty memory cells will be read from the set-up data region. One possible embodiment of the set-up data region will be described in some additional detail with reference to FIG. 3.

Returning to FIG. 2, a page buffer and decoder 120 operates as an input driver or a sensor amplifier according to the operational mode of flash memory device 100. Page buffer and decoder 120 senses and stores data in relation to selected memory cells of memory cell array 110 during a read operation. Page buffer and decoder 120 provides read data corresponding to a selected row address to an associated input/output (I/O) unit. The read data per selected memory cell provided to the I/O unit may be one or more bits of set-up data. It will be apparent to those skilled in the art that page buffer and decoder 120 may be implemented using a conventional Y-decoder which operates in conjunction with a row address to select memory cell array columns for the I/O unit.

Status detector 130 temporarily stores a set-up data provided by page buffer and decoder 120. In one embodiment, the set-up data provided by page buffer and decoder 120 is transferred to status detector 130 in an I/O unit (e.g., an 8-bit data unit). The 8-bit set-up data transferred to status detector 130 is interrogated for errors using, for example, a majority decision algorithm. Status detector 130 generates a status signal (e.g., a pass/fail signal) and transfers it to a set-up controller 150.

In one embodiment, status detector 130 interrogates the set-up data in relation to the empty area of the set-up data region and outputs the status signal as "Pass". In this embodiment, the memory cells in the empty area are maintained as an erased state. Accordingly, a data bit value of "1" corresponding to a memory cell in the empty area may be discarded and not stored by status detector 130. In another embodiment, the set-up data read from the empty area is decoded, and any decoded data bit value of "1" is stored in set-up data register 140. However, in this embodiment, a data bit indicating that it is invalid as a set-up data may be included in the bits stored in set-up data register 140.

The set-up data decoded by status detector 130 or data read from the empty area are stored in set-up data register 140, unless in a certain embodiment of the invention the decoded data corresponding to the empty area is discarded. Where the empty area is programmed with a predetermined data pattern, the decoded data corresponding to the empty area may be stored in set-up data register 140. In the decoded data corresponding to the empty area, an instruction bit may be included, where the instruction bit is used to block its use as a set-up data. The set-up data stored in set-up data register 140 may be used for trimming operations or repair of a defective memory cell.

Set-up controller 150 responds to the initialization enable signal (e.g. POR signal) provided by power-up detector 160 and controls the memory system initialization operation. During initialization, set-up controller 150 controls the operation of page buffer and decoder 120 to read the set-up data stored in the set-up data region. Then, set-up controller 150 determines whether to re-read the set-up data with reference to the status signal provided by status detector 130. Finally, set-up controller 150 may also be used to control certain memory system initialization operations, such as DC trimming or memory cell repair with reference to the set-up data stored in set-up data register 140.

Power-up detector 160 detects the internal power level when supplying power to flash memory device 100. If the detected internal voltage VDD increases above a predetermined threshold, power-up detector 160 generates the initialization enable signal. In general, the system initialization operation used to read set-up data (e.g., DC trimming data and/or defective memory cell repair) from the set-up data region, is performed during the power-up interval between the application of power and stabilization of the applied power voltage. Thus, as noted above, the read set-up data may contain one or more errors due to an unstable power voltage.

In one embodiment of the foregoing flash memory device 100 set-up data may be stored in memory cell array 110 using a so-called "spread program" approach. In such an embodiment, the set-up data is read from memory as spread data. Status detector 130 decodes the spread data provided during a read operation in order to restore it as set-up data. When status detector 130 receives spread data read from the empty area, it recognizes the stored origin of the data and determines the detected error results to be "Pass". The resulting status signal is communicated to set-up controller 150.

Then, status detector 130 either stores the set-up data in set-up data register 140 or discards it when it corresponds to the empty area. For example, in the one embodiment described above, the decoded spread data stored in the empty area is discarded. In the other embodiment described above, the decoded spread data from the empty area is stored in set-up data register 140, but it is stored with an instruction bit indicating the void nature of the data.

Any one of the foregoing operations may be performed during the power-up interval, and status detector 130 is thus able to provide highly reliable set-up data under unstable power voltage conditions. One example of an approach to set-up data programming and/or read operations will be presented below in relation to a 1:8 Spread Program or an 8:1 Majority Decision Algorithm. However, those skilled in the art will understand that the following examples may be modified in relation to specific memory device I/O structures.

Figure 3:
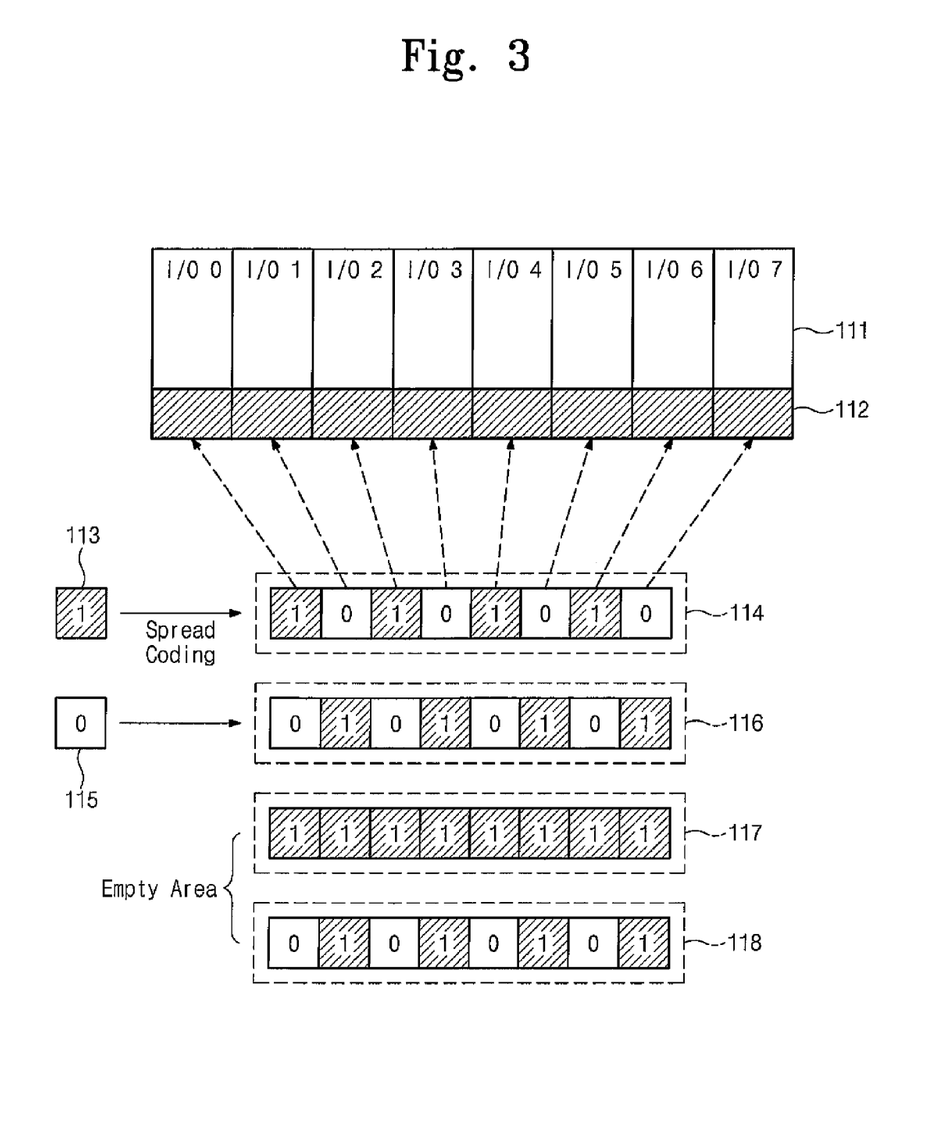
FIG. 3 is a block diagram briefly illustrating a programming method of a set-up data according to the present invention.

FIG. 3 conceptually illustrates a spread programming method for a set-up data according to an embodiment of the invention. Referring to FIG. 3, a memory cell array comprises a normal data region 111 where general data may be stored and a set-up data region 112 where set-up data is stored. Set-up data may be initially stored in set-up data region 112 during a testing process applied to the constituent memory device. A programming operation for the set-up data is assumed to use a spread program in which 1-bit data is extended to 8-bit data. The memory cells in an empty area within set-up data region 112 may be programmed to have an erased state, or may be programmed according to a predetermined pattern. An exemplary programming operation ascribed to set-up data region 112 will be described in some additional detail below.

As 1-bit data within the set-up data is programmed it is extended to a number of data bits corresponding to the I/O unit, hereafter the I/O number (e.g., 8-bits), and then programmed in set-up data region 112 using a defined spread program approach. As shown in FIG. 3, 1-bit data '1' (113) is extended to 8-bit data corresponding to the I/O unit (I/00-I/07). In other words, a set-up data value of '1' (113) is extended to an 8-bit spread data '10101010' (114), and each extended 8-bit data is programmed in set-up data region 112 consistent with the I/O unit, respectively. A set-up data bit value of '0' (115) is extended to a spread data '01010101' (116) and programmed in set-up data region 112. However, the memory cells in an empty area existing between memory cell array regions storing the set-up data may be programmed to have an erased status, (e.g., '11111111' (117)), or to have a predetermined data pattern (e.g., '01010101' (118)).

By using this spread program, as an example, to program set-up data region 111, a sufficiently reliable set-up operation may be implemented, such that data errors other wise caused by defective cell(s) or an unstable power supply are avoided. Further, the detection and recognition set-up data read from an empty area may be easily performed.

Figure 4:
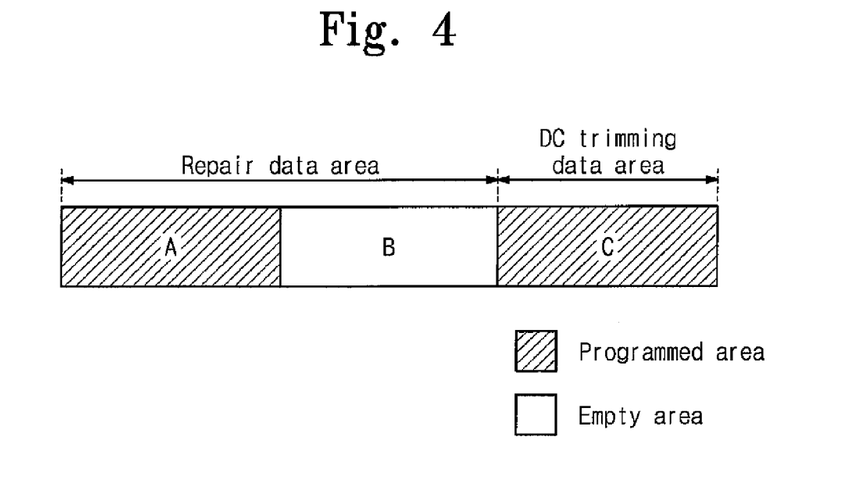
FIG. 4 illustrates briefly a written state of data of the set-up data region.

FIG. 4 further illustrates an exemplary set-up data region where data may be stored according to the programming method described in relation to FIG. 3. The illustrated region corresponds to one of the I/O units.

In the example illustrated in FIG. 4, the set-up data region corresponds to an I/O unit responsive to data stored in a repair data area and a DC trimming data area. The DC trimming data area may be assigned a fixed size in relation to the operating characteristics of the memory device. However, the size of the repair data area will vary according to the number of defective memory cells for each tested memory device. In the illustrated embodiment, repair data is programmed in an area 'A' of the repair data area. The DC trimming data is programmed in (fixed-size) DC trimming data area 'C'. However, repair data is not programmed in area 'B' of the repair data area. This area 'B' is an empty area within the memory cell array.

Figure 5:
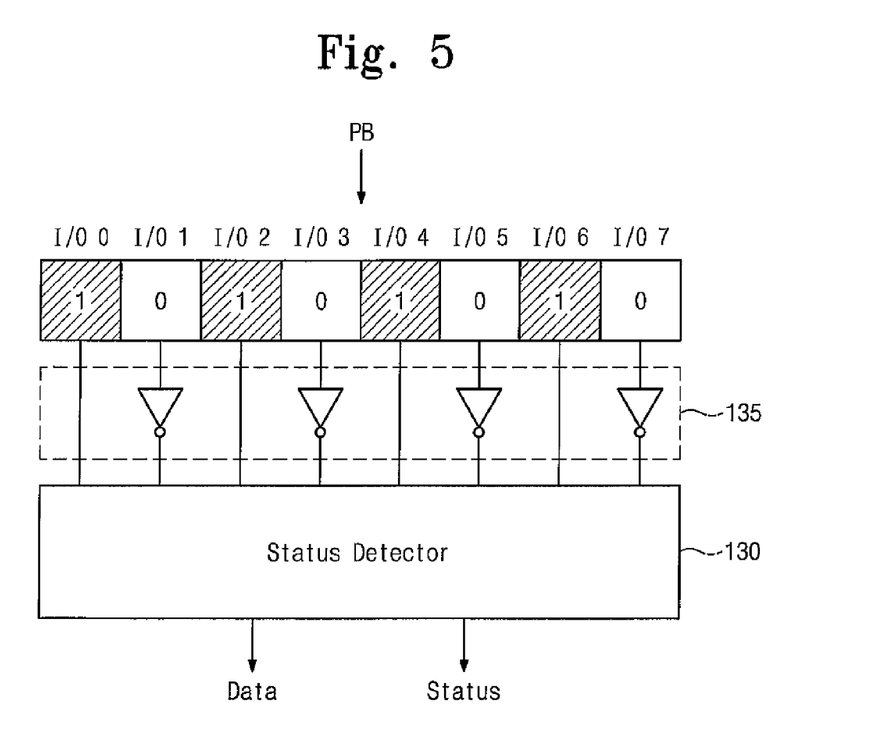
FIG. 5 is a block diagram briefly illustrating a status detector which decodes the read set-up data.

FIG. 5 further illustrates an operating relationship between page buffer and decoder 120 and status detector 130 of FIG. 2. Referring to FIGS. 2 and 5, the spread data detected and latched by page buffer and decoder 120 is transferred to status detector 130 in I/O units. However, the read spread data includes 4 bits of non-inverted data and 4-bits of inverted data in relation to the originally programmed data values. When the spread programming operation is executed, the data bits corresponding to even I/O lines (I/00, I/02, I/04, I/06) among the spread data are non-inverted bits. The data bits corresponding to odd I/O lines (I/01, I/03, I/05, I/07) among the spread data are inverted bits. In order to decode the 1-bit set-up data from the 8-bit spread data, the inverted bit(s) must be restored. The bits corresponding to odd I/O lines (I/01, I/03, I/05, I/07) are inverted by a selective inversion circuit 135 before the bits are transferred to status detector 130. With the 8-bit spread data restored by the selective inversion circuit 135, it may now be determined whether a data error is apparent by operation of status detector 130. If the 8-bit spread data contains errors less than a predetermined number of bits, status detector 130 outputs the status signal as "Pass".

Status detector 130 according to an embodiment of the invention scans (or interrogates) the restored 8-bit spread data to determine whether it is possible to properly decode it as 1-bit set-up data. More particularly, status detector 130 recognizes the spread data corresponding to an empty area to output the status signal as "Pass". If the transferred spread data is 1-bit or an allowable minority bit, status detector 130 outputs a status signal as "Pass". Status detector 130 decodes the 8-bit I/O unit of spread data into 1-bit set-up data. The 8-bit I/O unit of spread data may contain an error. Status detector 130 may then perform a decoding operation which is able to correct the identified error. And in case there is relatively a large of number of error bits, or it is not possible to make correction, the same spread data may be read again. For this, status detector 130 communicates the status signal as "Fail" to the set-up controller 150.

For example, when the spread data transferred to status detector 130 is '11110000', it is not possible to make a majority decision because the number of logic values '1' and '0' are the same. Or, when the number of error bits included in the read spread data is relatively large, the read spread data is not highly reliable. In other words, in a case where the read spread data is '10001100', hence the logic value '1' is 3 and the logic value '0' is 5, the data determined by a majority decision is not highly reliable. This is because the errant data bit may be a $5^{th}$ logic value of '0'. In order to increase the reliability of the spread data, an upper limit to the number of minority bits must be set. For example, one exemplary algorithm run by status detector 130 may be configured so that only in cases where the minority bit is less than 2 is valid spread data determined to exist. Alternatively, the algorithm run by status detector 130 may be configured so that only in cases where the minority bit is less than 1 is it determined that valid data exists. If more minority bits are detected than the predetermined number of minority bits, status detector 130 notifies the set-up controller 150 that that spread data is void for being invalid (or insufficiently reliable).

Upon receiving this indication, set-up controller 150 controls other memory device circuits and components, for example, page buffer and decoder 120 such that the page data including the spread data is re-read. Also status detector 130 may be used to determine the error detected results as "Pass" with the spread data corresponding to an empty area. Such an operation will be described below with reference to FIG. 6.

Figure 6:
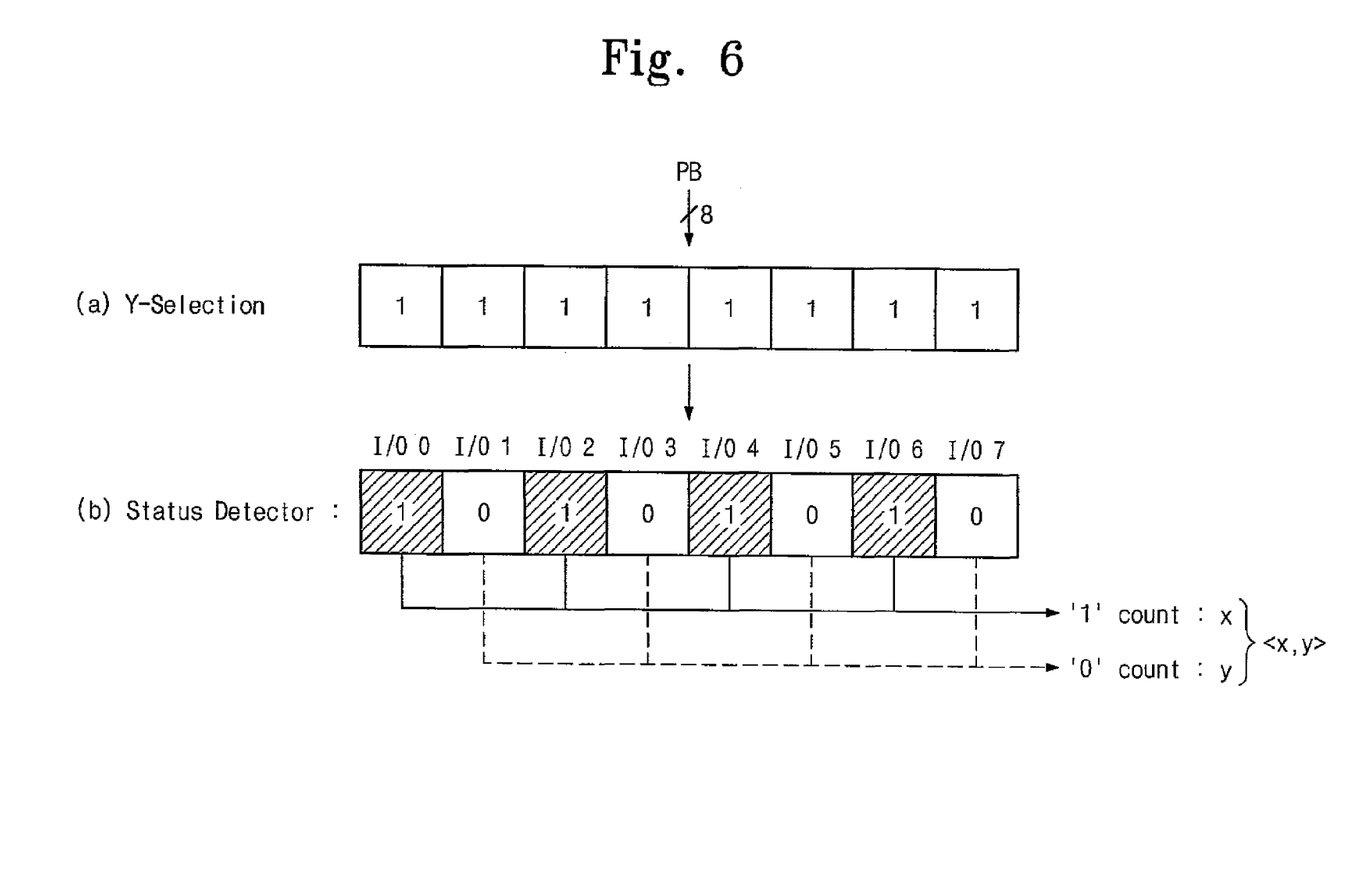
FIG. 6 illustrates a method of detecting an empty area data according the first exemplary embodiment of the present invention.

In the case where an error detected result is determined as "Pass", status detector 130 determines the 1-bit set-up data from corresponding 8-bit spread data using a Majority Decision Algorithm and communicates the results to set-up data register 140.

FIG. 6 illustrates one method embodiment of the invention capable of accounting for set-up data stored in an empty area in relation to the decoding approach described in relation to FIG. 5. According to this embodiment, the memory cells in the empty area of the set-up data area (112, see FIG. 3) have data values maintained in an erased state. In this case, if status detector 130 determines that a data error exists in relation to the number of minority bits, and a status signal of "Fail" is output, and the memory system initialization operation is stopped. However, if status detector 130 determines that the error detected results from spread data stored in memory cells corresponding to the empty area a status signal of "Pass" is output. This process is described in some additional detail below.

Read spread data corresponding to an empty area is latched to page buffer and decoder 120 and is set to all logic values of '1'. Therefore, the spread data provided by page buffer and decoder 120 is '11111111' in the working example. (See, 6(*a*) showing e.g., values in the Y selection buffer of page buffer and decoder 120). The spread data '11111111' is converted into a data '10101010' through a selective conversion operation. In the spread data transferred to status detector 130, the bits corresponding to even I/O lines (I/00, I/02, I/04, I/06) are '1111', and the bits corresponding to odd I/O lines (I/01, I/03, I/05, I/07) are '0000'.

As shown in 6(*b*), status detector 130 counts the number of '1' value bits and '0' value bits from the data read from the empty area. In other words, status detector 130 counts the number of '1' value bits corresponding to the even I/O lines (I/00, I/02, I/04, I/06). A variable "x" is used to indicate the number of '1' value bits. Status detector 130 also counts the number of '0' value bits corresponding to odd I/O lines (I/01, I/03, I/05, I/07). A variable "y" is used to indicate the number of '0' value bits. Status detector 130 then determines whether the status signal will be output to indicate "Pass" or "Fail". If the variables "x" and "y" have the same count value (e.g., <4,4>) or if the count value falls within an acceptable (e.g., correctable) error range (e.g., <4,3> or <3,4>), then status detector 130—recognizing the origins of the set-up data as an empty area—outputs the status signal as "Pass".

Figure 7:
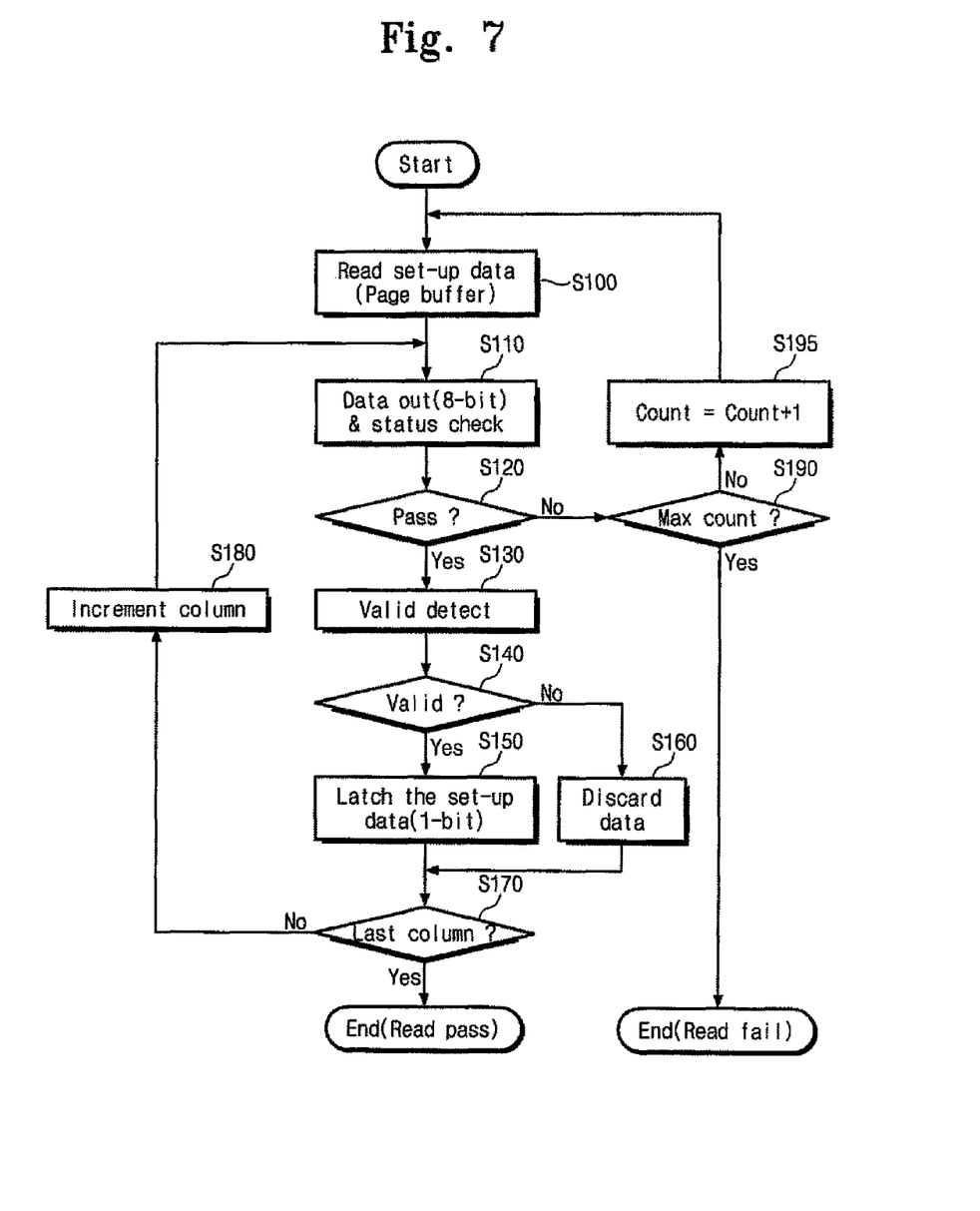
FIG. 7 is a flow diagram of a reading method of the set-up data according to the first exemplary embodiment of the present invention.

FIG. 7 is a flowchart summarizing a method of reading set-up data according to an embodiment of the invention and drawn in relation to the approach described in relation to FIG. 6. Referring to FIG. 6, status detector 130 during an initialization operation, receives spread data provided by page buffer and decoder 120 in defined I/O units. The spread data is detected by performing (e.g.,) an 8:1 decoding, and the decoded 1-bit data is stored in set-up data register 140. However, when the 8-bit spread data corresponding to the empty area is transferred, status detector 130 outputs the status signal as Pass, but does not store the decoded 1-bit data in set-up data register 140. A reading and detecting method for the set-up data and empty area data will be described in some additional detail below.

When power is supplied, power-up detector 160 detects a power voltage VDD level within the flash memory device. When the internal power voltage VDD level reaches a threshold level sufficient to performing an initialization operation, the initialization operation is performed under the control of set-up controller 150. Set-up controller 150 controls page buffer and decoder 120 to read a set-up data region (S100). Set-up data or empty area data is output from page buffer and decoder 120 in I/O units (e.g., 8 bits) and provided to status detector 130 (S100). Status detector 130 detects the spread data in I/O unit format to determine whether it is "Pass" or "Fail". In a case where the number of minority bits is larger than a predetermined limit, status detector 130 outputs the status signal as "Fail", and in a case where the number of minority bits is smaller than the predetermined limit, the status signal is output as "Pass". For the data corresponding to an empty area, status detector 130 outputs the status signal as "Pass" according to the algorithm described above in relation to FIG. 6 (S120). Status detector 130 decides whether the 8-bit spread data determined as "Pass" corresponds to valid set-up data or to data stored in an empty area (S130). Depending on this decision, it is determined whether the set-up data will be latched (S140). If the bit count for the spread data is detected as <8,0>, <7,1> or <0,8>, <1,7>, the spread data is decoded by a majority decision algorithm. And decoded 1-bit set-up data is stored at set-up data register 140 (S150). If the bit count of the spread data is detected as <4,4>, <4,3> or <3,4>, status detector 130 determines the spread data is from an empty data. Accordingly, the corresponding spread data is not stored in set-up data register 140 but discarded (S160). The decoding operation of the spread data is repeated until reading of the data is finished (S170). Row address is increased until the final set-up data of page buffer and decoder 120 is read. And the spread data is provided sequentially to status detector 130 (S180).

In a case where the number of errors included in the spread data output by status detector 130 is greater than the number of the standard number of bits, the read operation directed to the set-up data region (112, see FIG. 3) restarts (S190, S195). If the number of errors detected is less than the predetermined level, from the data output according to the re-reading operation, status detector 130 determines the status signal as "Pass", and the process moves to step S130. However, in a case where the error continues to occur, the read operation to the set-up data is performed until a Max count value is reached. When the read operation reaches the Max count value, the read operation directed to the set-up data is determined to "Fail".

According one of the foregoing embodiments, memory cells corresponding to an empty area are maintained as an erased state (e.g. '1') in the set-up data region. During a set-up operation, status detector 130 determines the error detected result of the empty area data as Pass. Although the empty area data is determined as Pass in error detection, the bit value decoded from the empty area data is blocked from being stored in set-up data register 140.

Figure 8:
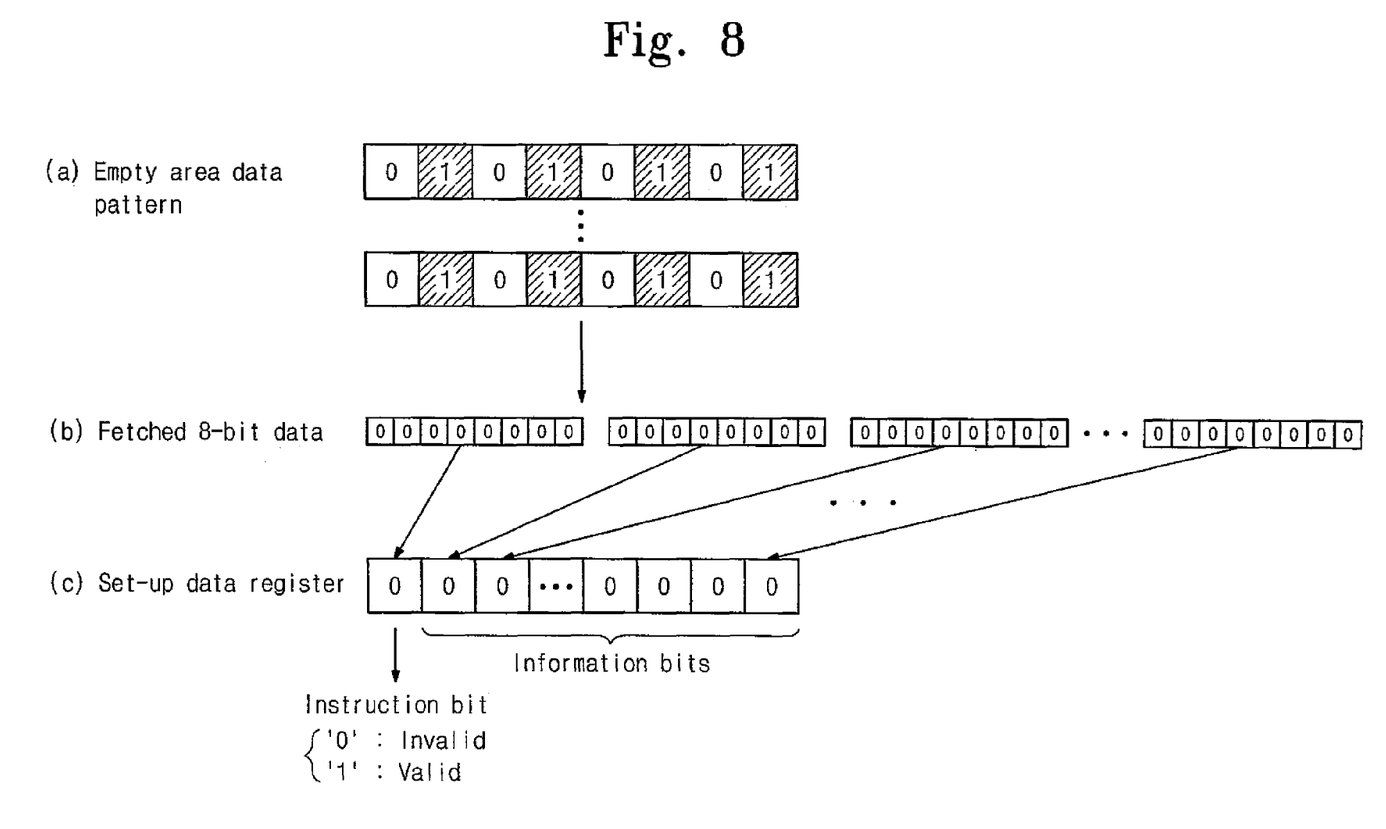
FIG. 8 illustrates a method of processing the empty area data according to the second exemplary embodiment of the present invention.

FIG. 8 illustrates another embodiment of the invention capable of processing read data corresponding to an empty area of the set-up data region. According to this embodiment, the empty area of the set-up data region of the cell array 110 is programmed in a predetermined pattern. For example, the empty area of the set-up data region is programmed a '01010101' according to each input/output unit. When the empty area corresponding to the set-up data region is read, it is stored in page buffer and decoder 120.

The spread data illustrated in FIG. 8(a) shows the read empty data output from page buffer and decoder 120. The sensed data of the set-up data region latched to page buffer and decoder 120 is output in I/O unit format (e.g. 8-bit unit) and provided to status detector 130.

As shown in FIG. 8(b), the spread data corresponding to empty area data is transferred to status detector 130. The spread data transferred to status detector 130 has value which the bits corresponding to odd I/O lines (I/01, I/03, I/05, I/07) are converted. The pattern of the empty area data '01010101' is provided to status detector 130 as a data '00000000'.

As shown in FIG. 8(c) empty area data stored in set-up data register 140 is decoded (e.g.,) by an 8:1 majority decision algorithm. However, the decoded data stored in set-up data register 140 includes an instruction bit which indicates that it is data read is from an empty area. In other words, the decoded bits corresponding to the empty area data stored in set-up data register 140 includes an instruction bit which indicates a valid set-up data or a void set-up data. The set-up data including the instruction bit indicating void is set so that it is not used during an initialization operation.

Figure 9:
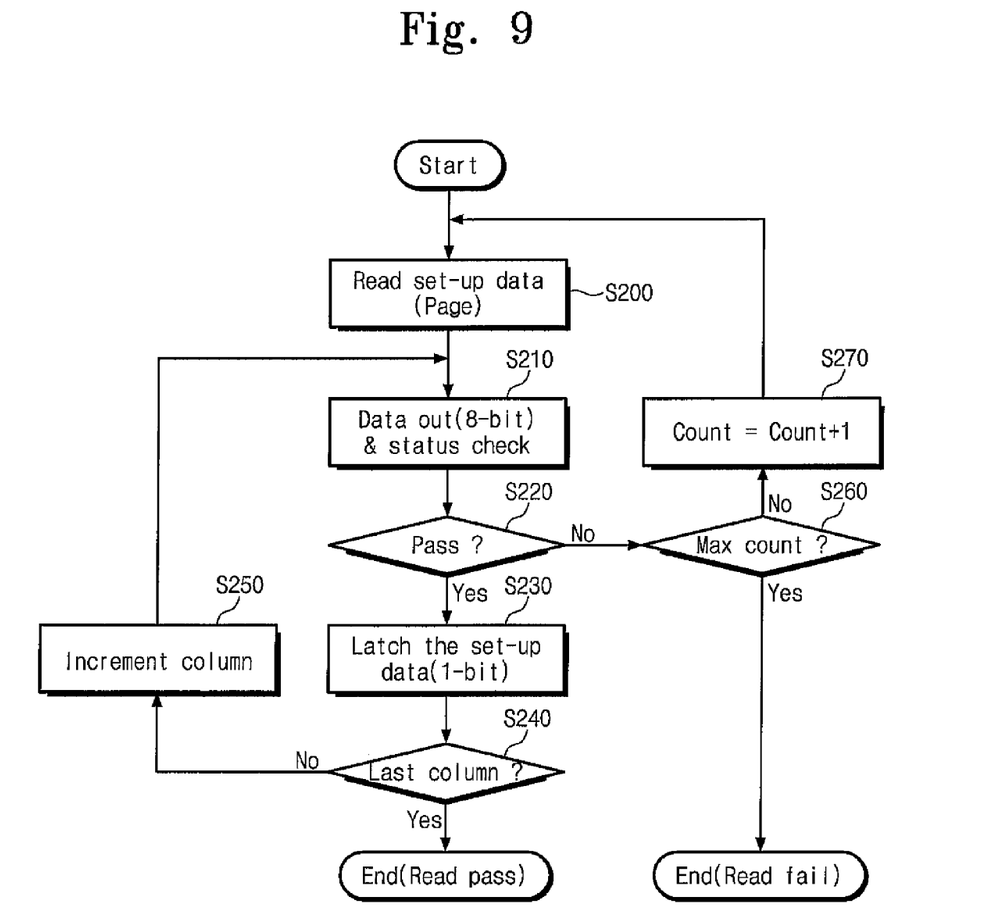
FIG. 9 is a flow diagram of a reading method of the set-up data according to the second exemplary embodiment of the present invention.

FIG. 9 is a flowchart summarizing an initialization operation applying the setting system of an empty area data of FIG. 8. Referring to FIG. 9, the spread data read from the empty area according to the second exemplary embodiment of the present invention is processed in the above system of FIG. 8. The spread data corresponding to the empty area is determined as Pass by status detector 130. The decoded 1-bit data are stored in set-up data register 140. However, the decoded set-up data stored in set-up data register 140 includes the instruction bit indicating empty area. Accordingly, the data corresponding to the empty area may be blocked from being used during an initialization operation. Below, the method of reading and detecting a set-up data and an empty area data will be described in further detail, with reference to the above drawings.

When power is supplied, power-up detector 160 detects the power voltage VDD within the flash memory device. When the internal power voltage VDD level reaches a threshold level ($V_1$), the initialization operation is performed by set-up controller 150. Set-up controller 150 controls page buffer and decoder 120 such that it reads a set-up data region (S200). A set-up data or empty area data are output from page buffer and decoder 120 in I/O unit (e.g. 8-bit) and provided to status detector 130 (S210). Status detector 130 detects error in the spread data to output the status signal indicating "Pass" or "Fail". In a case where the number of minority bits is greater than a predetermined limit, status detector 130 outputs the status signal as "Fail", and in a case where the number of minority bits is less than the predetermined number of bits, status detector 130 outputs the status signal instructing as "Pass". Status detector 130 also outputs a status signal indicating "Pass", as the empty area data is programmed in a predetermined pattern (e.g. '01010101') (S220). Status detector 130 decodes the 8-bit spread data determined as Pass, to a 1-bit set-up data. The decoded data is stored in set-up data register 140 (S230). The I/O unit operation of the spread data is repeated until read operation directed to the set-up data is finished (S240). Page buffer and decoder 120 increases row address until the final data among the set-up data is output and outputs spread data to provide to status detector 130 (S250).

However, if there are more errors in the spread data output to status detector 130 than the predetermined limit, status detector 130 determines the error detected result as "Fail" (S220). Then the process moves on to step (S260)—a re-reading operation directed to the set-up data region. The re-reading operation is determined as Pass if error is not detected under a predetermined level, thus the process moves on to the step S230. The Max count value for re-reading the same data is predetermined. However, if it is determined as "Fail" continuously, and the re-reading count reaches the Max count value, the read operation directed to the set-up data is indicated as "Fail".

According to the embodiment of the invention described with reference to FIG. 9, the spread data corresponding to an empty area is decoded according to a defined processing method, for example, a majority decision algorithm, and stored in set-up data register 140. However, the data of set-up data register 140 having a bit value indicating that the instruction bit is void is blocked from being used in the initialization operation.

Figure 10:
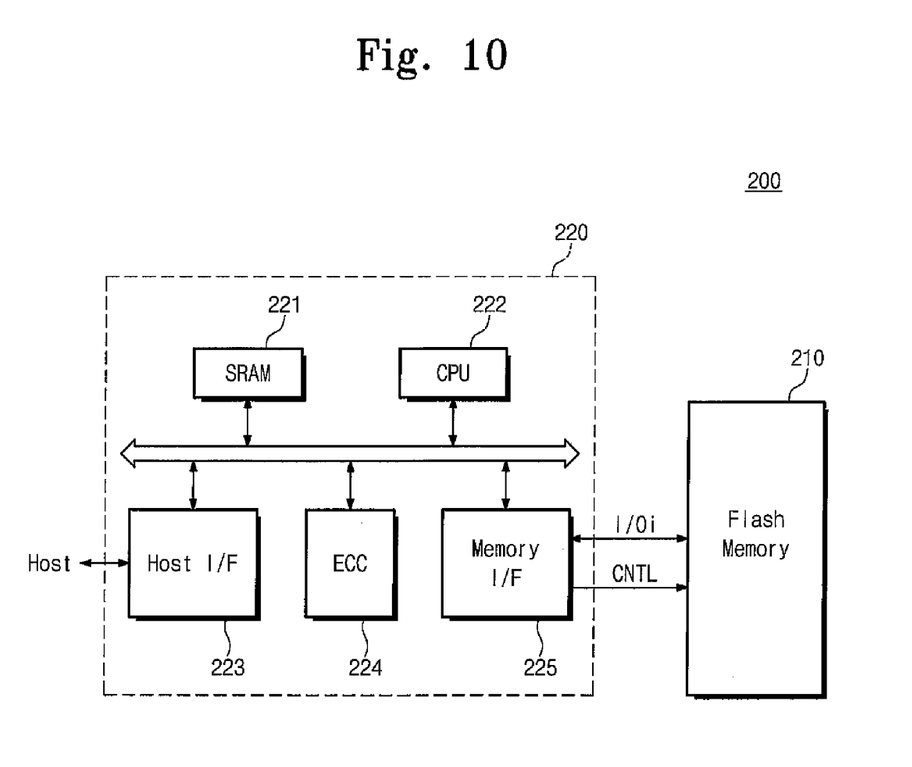
FIG. 10 is a block diagram briefly illustrating a memory card having a flash memory device according to the present invention.

FIG. 10 is a block diagram of a memory card 200 incorporating a flash memory device 210 designed to operate in a manner consistent with at least one of the foregoing embodiments. Referring to FIG. 10, memory card 200 supports high-capacity data storage provided by one or more flash memory device(s) 210. Memory card 200 comprises a memory controller 220 which controls various data exchange between a Host and flash memory device 210. Memory card 200 is able to perform a highly reliable initialization operation during the initialization operation performed after power is supplied. Accordingly, a memory card having a high reliability may be provided.

SRAM 221 is used as an operation memory of a processing unit 222. A host interface 223 has a data exchange protocol of the host connected to the memory card 200. An error correction block 224 detects and corrects error included in the data read from the multi-bit flash memory device 210. A memory interface 225 interfaces with the flash memory device 210 of the present invention. The processing unit 222 performs various control operations for exchanging data of the memory controller 220. Although not shown, it should be obvious to a person in the art that the memory card 200 according to the present invention may be further provided with ROM (not shown) which stores code data for interfacing with the Host.

The above flash memory device of the present invention may significantly decrease set-up data error generated in an initialization operation performed during a power-up interval. And it processes the spread data corresponding to an empty area subject to be generated and it may increase operation reliability of the flash memory device.

As described above, the flash memory device of the present invention distributes set-up data in a cell array region and programs them, and the set-up data may be decoded using the Majority Decision Algorithm in an initialization operation to be provided as the set-up data. The flash memory device recognizes the data corresponding to empty area and output the error detected result as "Pass". Therefore, a flash memory device and a flash memory system with high reliability may be provided.

Although the present invention has been described in connection with various embodiments illustrated in relation to the accompanying drawings, it is not limited thereto. It will be apparent to those skilled in the art that various substitution, modifications and changes may be made thereto without departing from the scope of the invention as defined by the following claims.

What is claimed is:

1. A flash memory device comprising:
a memory cell array including a set-up data region configured to store set-up data, wherein the set-up data comprises repair data and empty area data, the empty area data being stored in an empty cell area of the set-up data region not used to store the repair data;
a page buffer and decoder configured to read the set-up data from the set-up data region; and
a status detector configured to receive the set-up data from the page buffer and decoder, independently determine the respective validity of the repair data and the empty area data, and generate a Pass/Fail status signal.

2. The flash memory device of claim 1, wherein the set-up data region comprises a plurality of regions respectively corresponding to a plurality of input/output (I/O) lines, and at least some of the set-up data is respectively extended to the plurality of regions to be programmed.

3. The flash memory device of claim 2, wherein bits of at least some of the set-up data corresponding to even I/O lines are programmed to a first logic value and bits of at least some of the set-up data corresponding to odd I/O lines are programmed to a second logic value.

4. The flash memory device of claim 3, wherein the status detector is further configured to decode the repair data and restore at least one bit value of the set-up data to an originally programmed bit value.

5. The flash memory device of claim 4, wherein the page buffer and decoder are further configured to sense memory cells storing the set-up data and latch the sensed data if the Pass/Fail status signal provides a Fail indication, and
the flash memory device further comprises:
a set-up data register configured to store decoded set-up data provided by the status detector, wherein the set-up data latched in the page buffer and decoder is transferred to the status detector in an I/O unit format.

6. The flash memory device of claim 5 further comprising:
a set-up controller responsive to the Pass/Fail status signal and configured to control the page buffer and decoder to re-read the set-up data in response to a Fail indication by the Pass/Fail status signal.

7. The flash memory device of claim 6 further comprising:
a selective conversion circuit configured to receive set-up data from the page buffer and decoder, selectively convert the logic values for bits of the set-up data corresponding to at least one of the odd I/O lines and the even I/O lines, and transfer the converted set-up data to the status detector.

8. The flash memory device of claim 7, wherein the status detector is further configured to provide a Fail indication using the Pass/Fail status signal upon determining a number of minority bits within the repair data is greater than a predetermined limit.

9. The flash memory device of claim 5, wherein all bits of the empty area data are programmed to an erased state or to a predetermined data pattern.

10. The flash memory device of claim 9, wherein the status detector is further configured to block the empty area data from being stored in the set-up data register when the empty area data is programmed to the erased state.

11. The flash memory device of claim 10, wherein data bits determined by the status detector for the empty area data and stored in the set-up data register include at least one bit value indicating a void in the empty area data.

12. A method of initializing a flash memory device having set-up data programmed in a set-up data region of a memory cell array, the method comprising:
programming repair data within the set-up data using a spread data programming technique;
programming empty area data within the set-up data in an empty cell area of the set-up data region according to a predetermined pattern wherein the empty cell area is not used to store the repair data;
upon initialization of the flash memory device, reading the set-up data and decoding the set-up data to independently determine the respective validity of the repair data and the empty area data; and
determining whether one or more errors is apparent in the repair data and storing the repair data in a register.

13. A memory system comprising:
a flash memory device and a memory controller configured to control the flash memory device, wherein the flash memory device comprises:
a memory cell array including a set-up data region configured to store set-up data, wherein the set-up data comprises repair data and empty area data, the empty area data being stored in an empty cell area of the set-up data region not used to store repair data;
a page buffer and decoder configured to read the set-up data from the set-up data region; and
a status detector configured to receive the set-up data from the page buffer and decoder, independently determine the respective validity of the repair data and the empty area data, and generate a Pass/Fail status signal.

14. The memory system of claim 13, wherein the set-up data region comprises a plurality of regions respectively corresponding to a plurality of input/output (I/O) lines, and at least some of the set-up data is respectively extended to the plurality of regions to be programmed.

15. The memory system of claim 14, wherein bits of at least some of the set-up data corresponding to even I/O lines are programmed to a first logic value and bits of at least some of the set-up data corresponding to odd I/O lines are programmed to a second logic value.

16. The memory system of claim 15, wherein the status detector is further configured to decode the repair data and restore at least one bit value of the set-up data to an originally programmed bit value.

17. The memory system of claim 16, wherein the page buffer and decoder is further configured to sense memory cells storing the set-up data and latch the sensed data if the Pass/Fail status signal provides a Fail indication, and
the flash memory device further comprises:
a set-up data register configured to store decoded set-up data provided by the status detector, wherein the set-up data latched in the page buffer and decoder is transferred to the status detector in an I/O unit format.

18. The memory system of claim 17 further comprising:
a set-up controller responsive to the Pass/Fail status signal and configured to control the page buffer and decoder to re-read the set-up data in response to a Fail indication by the Pass/Fail status signal.

19. The memory system of claim 18 further comprising:
a selective conversion circuit configured to receive set-up data from the page buffer and decoder, selectively convert the logic values for bits of the set-up data corresponding to at least one of the odd I/O lines and the even I/O lines, and transfer the converted set-up data to the status detector.

20. The memory system of claim 19, wherein the status detector is further configured to generate a Fail indication using the Pass/Fail status signal upon determining a number of minority bits within the repair data is greater than a predetermined limit.

* * * * *